United States Patent [19]

Moore et al.

[11] Patent Number: 5,281,684
[45] Date of Patent: Jan. 25, 1994

[54] SOLDER BUMPING OF INTEGRATED CIRCUIT DIE

[75] Inventors: Kevin D. Moore, Schaumburg; Carl Missele, Elgin, both of Ill.

[73] Assignee: Motorola, Inc., Schaumburg, Ill.

[21] Appl. No.: 876,147

[22] Filed: Apr. 30, 1992

[51] Int. Cl.⁵ .............................................. C23C 26/00
[52] U.S. Cl. .................... 427/96; 427/374.6; 427/376.7; 228/180.22; 29/840; 29/843
[58] Field of Search ............ 427/96, 376.7, 374.6; 228/180.2; 29/840, 843

[56] References Cited

U.S. PATENT DOCUMENTS

| | | | |
|---|---|---|---|
| 3,458,925 | 8/1969 | Napier | 427/374.6 |
| 4,273,859 | 6/1981 | Mones | 427/96 |
| 4,450,188 | 5/1984 | Kawasumi | 427/96 |
| 4,661,192 | 4/1987 | McShane | 228/180.2 |
| 4,661,375 | 4/1987 | Thomas | 427/96 |
| 4,729,165 | 3/1988 | Fahrenschon | 427/96 |
| 5,048,747 | 9/1991 | Clark | 228/180.2 |
| 5,092,034 | 3/1992 | Altendorf | 29/840 |
| 5,135,155 | 8/1992 | Kang | 228/180.2 |

FOREIGN PATENT DOCUMENTS 3073503 3/1991 Japan ........................... 427/96

Primary Examiner—Shrive Beck
Assistant Examiner—Vi Duong Dang
Attorney, Agent, or Firm—Douglas D. Fekete

[57] ABSTRACT

A method for forming a solder bump on an integrated circuit die utilizes a terminal (12) formed of an electrically conductive, solder-wettable composite material composed of copper particles and a polymeric binder. The terminal comprises a bond pad (24) overlying a passivation layer (20) on the die and a runner section (26) connecting the bond pad to a metal contact (16). The terminal is applied to the die, for example, as an ink by screen printing, after which a body of solder alloy is reflowed in contact with the bond pad to form the bump. A preferred material for the terminal is composed of silver-plated copper particles and a resol type phenolic binder.

11 Claims, 1 Drawing Sheet

SOLDER BUMPING OF INTEGRATED CIRCUIT DIE

BACKGROUND OF THE INVENTION

This invention relates to forming a solder bump on an integrated circuit die. More particularly, this invention relates to such method that includes reflowing the solder alloy onto a terminal formed of an electrically conductive, solder-wettable composite material composed of copper particles and a polymeric binder.

In the manufacture of a microelectronic device, it is known to mount an integrated circuit die to a printed circuit board or the like by a plurality of solder bump interconnections that not only physically attach the die, but also electrically connect a circuit on the die to a circuit on the board for conducting electrical signals to and from the die for processing. For this purpose, a metal pad is formed on the die. A body of solder alloy, such as a preformed microball, is placed onto the pad, heated and cooled to reflow the solder to form a bump that is attached to the die. The area about the pad is covered by a material that is not wet by the solder to prevent the solder from spreading across the surface. The die is then assembled with the board such that the bump rests upon a terminal on the board, whereafter the assembly is heated to reflow the solder, thereby bonding the bump to the board to complete the interconnection.

The design of an integrated circuit die is relatively costly and includes the expense of designing and fabricate numerous masks to arrange and build up the many electrical features. In the past, terminals have been placed adjacent to the perimeter to facilitate wire bonding. Frequently, it is desired to utilize a conventional die, which features perimeter terminals for wire bonding, in a package that includes solder bump interconnections. However, the crowding of the terminals about the perimeter restricts the size of each bump, thereby making it more difficult to handle and accurately position the solder on the terminals and interfering with the formation of discrete bumps. Thus, it is desired to redistribute the terminal pads across the die surface to permit larger bumps to be employed. common processes for applying and patterning additional metallic layers significantly contribute to the cost of the die. Accordingly, it is desired to provide a relatively simple and inexpensive method for redistributing terminal pads on an integrated circuit die to facilitate solder bump interconnections, while avoiding the expense of redesigning the die.

SUMMARY OF THE INVENTION

This invention contemplates an improved method for forming a solder bump on a terminal of an integrated circuit die. The die is covered by a passivation layer and includes a metallic contact accessible through an opening in the layer. In accordance with this invention, the method includes forming a terminal of an electrically conductive, solder-wettable composite material composed of copper particles and a polymeric binder. The terminal includes a bond pad overlying the passivation layer remote from the metal contact and a runner that extends from the pad to the metal contact. A body of solder metal is reflowed onto the bond pad to form a bump bonded to the pad and electrically coupled through the runner. Thus, the method of this invention allows the bond pads to be conveniently distributed across the surface of a die and coupled to metal contacts which may have been originally designed, for example, as wire bond pads.

DESCRIPTION OF THE DRAWINGS

The present invention will be further illustrated with reference to the accompanying drawings wherein.

DETAILED DESCRIPTION OF THE INVENTION

Figure 1:
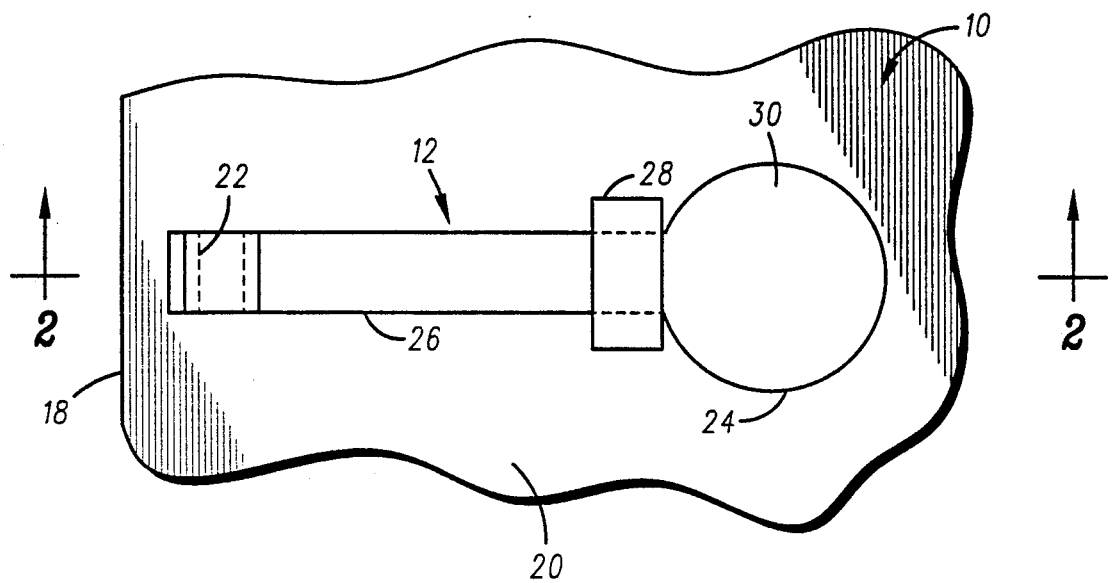
FIG. 1 is a partial plan view of an integrated circuit die showing a terminal formed in accordance with this invention.
Figure 2:
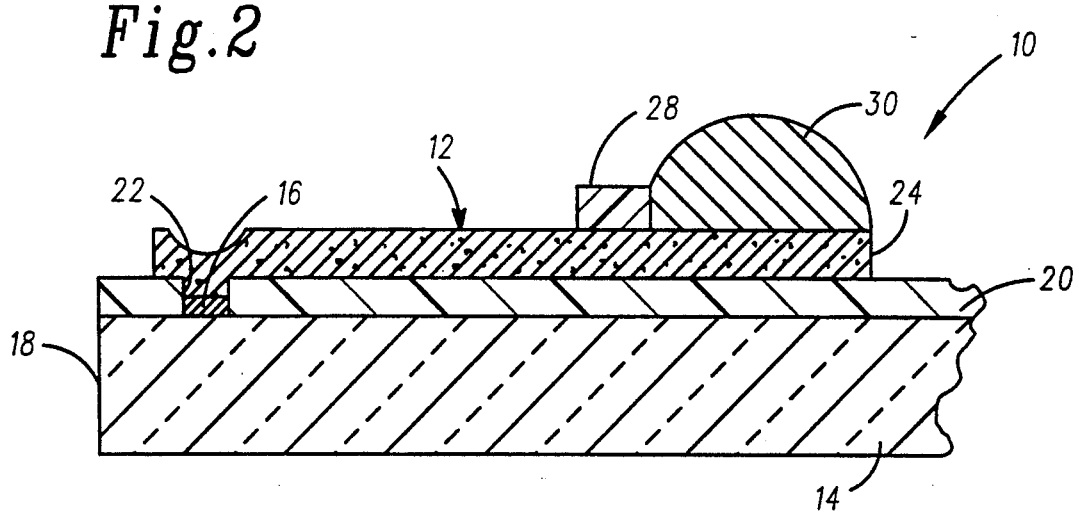
FIG. 2 is a cross-sectional view of the die in FIG. 1, taken along the line 2—2 in the direction of the arrows.

In accordance with a preferred embodiment, referring to FIGS. 1 and 2, an integrated circuit die 10 comprises a metal-resin composite terminal 12 formed in accordance with this invention. A preferred die 10 comprises a silicon substrate 14 on which is preformed electronic features, including transistors (not shown) interconnected in a circuit for processing electrical signals to perform dynamic random access memory. The circuit includes an aluminum metal contact 16 disposed adjacent edge 18. Die 10 further comprises a passivation layer 20 formed of a dielectric polymer that substantially covers the substrate 14 to protect the electrical features and has an opening 22 through which contact 16 is accessible. Die 10 is adapted for assembly with a printed circuit board to form a microelectronic package and includes a plurality of contacts similar to contact 16 that are adapted for connection to a circuit trace on the board for conducting electrical signals to and from the die for processing. Except for terminals such as terminal 12 formed in accordance with this invention, it is appreciated that die 10 features a conventional design wherein the contacts are arrayed about the die perimeter to facilitate formation of wire bond connections. It is a significant advantage that this invention makes use of a conventional die design that was initially intended for wire bonding and adapts the die for incorporation into a package by solder bump interconnections.

In the manufacture of die 10, a silicon wafer is processed to form a plurality of dies concurrently and is thereafter sectioned to divide the discrete dies. It is another advantage that this invention may be carried out to form terminals 12 prior to sectioning, thereby permitting the terminals to be readily and conveniently formed on the several dies using common processing steps.

To form terminal 12, die 10 is fabricated with contact 16 exposed through opening 22 in passivation layer 20. Terminal 12 is formed of a composite material composed of silver-plated copper powder in a resol type phenolic binder. An ink is screen printed onto the die in the pattern of the desired terminal. A preferred ink is composed of between about 80 and 90 weight percent silver-plated copper powder, between about 10 and 20 weight percent polymeric precursor for the binder, between about 5 and 15 weight percent dipropylene glycol methyl ether solvent, and includes minor (less than 1 weight percent) amounts of sobitan triolate, isopropyl thirsostearayl titanate, and ortho amino phenol compound, and is commercially available from Minico, under the trade designation M-6300 Solderable Copper Paste. The precursor is a partially crosslinked reactive product of phenol and an excess of formaldehyde. The ink is screen-printed onto the surface utilizing a stainless steel screen coated with a photodevelopable emulsion having an opening corresponding to the desired terminal. The ink is applied, dried and cured in air at a temperature of about 165° C. for about 30 minutes. The resulting terminal has a thickness on the order of about 20 microns and is characterized by copper particles densely packed in a continuous network to provide a low electrical resistance path and tightly bonded by the resin.

Terminal 12 comprises a circular bond pad 24 overlying passivation layer 20 spaced apart from contact 16. A runner 26 connects bond pad 24 with the contact 16. It is found that the screen printed composite material not only tightly adheres to the polyimide resin of layer 20, but also bonds to pad 16 to form a low resistance electrical connection.

Following the application of terminal 12, a solder bump 30 is applied to bond pad 24. Prior to forming bump 30, a stop 28 formed of a polymeric solder resist material is applied to runner 26 to confine the solder to bond pad 24. Thereafter, a microsphere of a solder alloy, such as tin-lead solder alloy containing about 40 weight percent lead and the balance tin, is pressed onto pad 24. The assembly is heated to a temperature of about 183° C. to melt the solder alloy, whereupon the solder alloy coalesces to form bump 30. Upon cooling, solder bump 30 solidifies and is bonded to pad 24. Following application of bump 30, die 10 is ready for mounting onto a printed circuit board or other suitable substrate by solder bump interconnections.

Thus, this invention provides a convenient method for adapting a conventional die having wire bond contacts for use in a package featuring solder bump interconnections. While this invention has been illustrated to form a single terminal 12, it is intended that the method be carried out to concurrently form a plurality of such terminals, each conected to a distinct contact. Also, in the described embodiment, bond pad 24 has a diameter greater than the width of the adjacent runner 26, and also greater than the width of contact 16. In this manner, the pad area may be optimized to form a bump 30 having a size greater than would otherwise be permitted if formed directly on the restricted area of contact 16. The length and contour of the runner section 26 may be configured to arrange the bond pads into the desired pattern conducive to forming the interconnections, for example, by providing a runner having curved or intersecting linear sections. Also, in an alternate embodiment, bumps may be formed without a solder stop as in the described embodiment by limiting the spread of solder along the runner during reflow. This may be accomplished, particularly for relatively large bumps, by constricting the width of the runner section relative to the bond pad, or by limiting the time during which the solder is molten during reflow, or by selecting the composite material to reduce the capillary forces that would otherwise draw the solder along the runner.

While in the described embodiment the solder metal is applied as a preformed microball, the solder may be deposited by any suitable process, including vapor deposition or electroplating. Also, a paste comprising solder metal powder dispersed in a vaporizable vehicle may be applied and heated to melt the solder powder, whereupon the solder coalesces to form a body that is the basis for the bump. In the described embodiment, the bump is formed of near-eutectic tin-lead solder alloy. Such alloys generally contain between about 35 and 45 weight percent lead and the balance tin and may include minor additives of silver or other metals to enhance metallurgical properties. The method may be suitable adapted to form bumps of other solder metals. These include tin-lead alloys composed of less than 10 weight percent lead, preferably about 5 weight percent, as well as tin-base alloys containing indium.

The method of this invention utilizes a composite material in forming the terminals 12. The material is composed of a continuous network of copper particles bonded by a polymeric matrix. Preferably, the material comprises at least about 70 weight percent copper particles. In addition to its high electrical conductivity, copper also is readily wet by molten solder, which wetting is essential to form a strong solder bond. In the preferred embodiment, the copper particles also include a silver plating. While not limited to any particular theory, solder does not bond to polymer materials of the type utilized to form the binder. Thus, it is believed that the solder bonds to copper particles at the surface of the bond pad. The silver plate is believed to protect the copper surface from oxidation that would otherwise inhibit wetting by the solder alloy. During reflow, the silver exposed at the bond pad surface is dissolved into the solder, thereby exposing the underlying copper, which is clear of oxide contamination, for forming the desired bond. The binder may be formed of any polymer that resists thermal degradation at solder reflow temperatures, typically between about 180° to 325° C., and is effective to bond the copper particles into an integral film that tightly adheres to the die surface, including both the metal and polymer regions.

While this invention has been described in terms of certain embodiments thereof, it is not intended that it be limited to the above description, but rather only to the extent set forth in the claims that follow.

The embodiments of the invention in which an exclusive property or privilege is claimed are defined as follows:

1. A method for forming a solder bump on an integrated circuit die comprising a substrate, a passivation layer overlying the substrate and a metal contact exposed through an opening in the layer, said method comprising forming a terminal on said die, said terminal comprising a bond pad overlying said passivation layer remote from the metal contact and a runner section extending between the bond pad and the metal contact for conducting electrical signals therebetween, said terminal being formed of an electrically conductive, solder-wettable composite material composed of copper particles and a polymeric binder, and heating and cooling a body of a solder metal in contact with the bond pad to reflow the metal to form a solder bump bonded to the bond pad.

2. The method in accordance with claim 1 wherein the copper particles include a silver coating.

3. The method in accordance with claim 1 wherein the binder is composed of a resol type phenolic resin.

4. A method for forming a solder bump on an integrated circuit die comprising a substrate, a passivation layer overlying the substrate and formed of a dielectric polymer material, and a metal contact exposed through an opening in the layer, said method comprising printing a copper powder ink onto the die in a pattern corresponding to a terminal having a bond pad overlying the passivation layer spaced apart from the metal contact and a runner section extending between the bond pad and the metal contact, said ink comprising at least about 70 weight percent copper particles and a vehicle, said vehicle comprising a resol type phenolic resin and a vaporizable solvent, and drying and curing the ink pattern to bond the copper particles into an unitary film to form an electrically conductive, solder-wettable terminal, and heating and cooling a body of a solder alloy in contact with the bond pad to reflow the alloy to form a solder bump bonded to the bond pad.

5. The method in accordance with claim 4 wherein the copper particles include a silver coating.

6. The method in accordance with claim 4 further comprising applying a solder resist to the terminal runner section prior to forming the bump for containing the solder alloy at the bond pad.

7. The method in accordance with claim 4 wherein the terminal comprises a generally circular bond pad having a diameter and a runner having a linear section adjacent to the bond pad and having a width less than the diameter.

8. A method for forming a solder bump on an integrated circuit die comprising a substrate, a passivation layer overlying the substrate and formed of a dielectric polymer material, and an aluminum metal contact exposed through an opening in the layer, said method comprising printing a copper powder ink onto the die in a pattern corresponding to a terminal having a bond pad overlying the passivation layer spaced apart from the metal contact and a runner section extending between the bond pad and the metal contact, said ink comprising at least about 70 weight percent silver-coated copper particles and a vehicle, said vehicle comprising a resol type phenolic resin and a vaporizable solvent, heating the ink pattern to cure the resin to bond the copper particles into an unitary film to form an electrically conductive, solder-wettable terminal, and heating and cooling a body of a solder alloy in contact with the bond pad to reflow the alloy to form a solder bump bonded to the bond pad.

9. The method in accordance with claim 8 further comprising applying a solder resist to the runner section prior to forming the bump for containing the solder alloy at the bond pad during reflow.

10. The method in accordance with claim 8 wherein the terminal comprises a generally circular bond pad having a diameter and a runner having a linear section adjacent to the bond pad and having a width less than the diameter.

11. The method in accordance with claim 8 wherein the solder alloy comprises tin and lead.

* * * * *